(12) United States Patent
Lee

(10) Patent No.: US 9,793,676 B1
(45) Date of Patent: Oct. 17, 2017

(54) SOLID-STATE OPTICAL AMPLIFIER HAVING AN ACTIVE CORE AND DOPED CLADDING IN A SINGLE CHIP

(71) Applicant: DICON FIBEROPTICS, INC., Richmond, CA (US)

(72) Inventor: Ho-Shang Lee, El Sobrante, CA (US)

(73) Assignee: DICON FIBEROPTICS, INC., Richmond, CA (US)

( * ) Notice: Subject to any disclaimer, the term of this patent is extended or adjusted under 35 U.S.C. 154(b) by 0 days.

(21) Appl. No.: 15/344,730

(22) Filed: Nov. 7, 2016

(51) Int. Cl.
| | |
|---|---|
| H01S 3/06 | (2006.01) |
| H01S 3/063 | (2006.01) |
| H01L 33/00 | (2010.01) |
| H01L 33/06 | (2010.01) |
| H01L 33/24 | (2010.01) |
| H01L 33/30 | (2010.01) |
| H01L 33/32 | (2010.01) |
| H01L 33/38 | (2010.01) |
| H01L 33/58 | (2010.01) |
| H01L 33/62 | (2010.01) |
| G02B 6/12 | (2006.01) |
| H03F 3/08 | (2006.01) |
| H01S 3/067 | (2006.01) |
| H01S 3/00 | (2006.01) |

(Continued)

(52) U.S. Cl.
CPC .......... *H01S 3/0627* (2013.01); *G02B 27/286* (2013.01); *H01L 33/0079* (2013.01); *H01L 33/06* (2013.01); *H01L 33/24* (2013.01); *H01L 33/30* (2013.01); *H01L 33/32* (2013.01); *H01L 33/38* (2013.01); *H01L 33/58* (2013.01); *H01L 33/62* (2013.01); *H01S 3/005* (2013.01); *H01S 3/06754* (2013.01); *H01S 3/0933* (2013.01); *H01S 3/1603* (2013.01); *H03F 3/08* (2013.01)

(58) Field of Classification Search
CPC ... G02B 6/12; G02B 6/12004; H01L 33/0079; H01L 33/06; H01L 33/24; H01L 33/30; H01L 33/32; H01L 33/38; H01L 33/58; H01L 33/62
See application file for complete search history.

(56) References Cited

U.S. PATENT DOCUMENTS 5,365,538 A * 11/1994 Tumminelli .......... H01S 3/0632
372/66
6,721,087 B2 4/2004 Alduino et al.
(Continued)

FOREIGN PATENT DOCUMENTS

WO 2008117249 A1 10/2008

OTHER PUBLICATIONS

Fukuda et al., "Silicon Photonic Circuit with Polarization Diversity," Optics Express 16(7):4872-4880, Mar. 26, 2008.
(Continued)

*Primary Examiner* — Eric Bolda
(74) *Attorney, Agent, or Firm* — Vierra Magen Marcus LLP

(57) ABSTRACT

A solid-state optical amplifier is described, having an active core and doped cladding in a single chip. An active optical core runs through a doped cladding in a structure formed on a substrate. A light emitting structure, such as an LED, is formed within and/or adjacent to the optical core. The cladding is doped, for example, with erbium or other rare-earth elements or metals. Several exemplary devices and methods of their formation are given.

28 Claims, 15 Drawing Sheets

(51) Int. Cl.
    *H01S 3/16*     (2006.01)
    *G02B 27/28*     (2006.01)
    *H01S 3/0933*     (2006.01)

(56) References Cited

U.S. PATENT DOCUMENTS

| | | | |
|---|---|---|---|
| 7,130,111 B2 | 10/2006 | Alduino et al. | |
| 8,619,358 B2* | 12/2013 | Kimerling | H01S 3/0632 359/344 |
| 2009/0231682 A1* | 9/2009 | Kashyap | G01M 11/319 359/341.1 |
| 2012/0051686 A1* | 3/2012 | Pitwon | G02B 6/12004 385/14 |

OTHER PUBLICATIONS

Polman et al., "Broadband Sensitizers for Erbium-Doped Planar Optical Amplifiers: Review", Journal of the Optical Society of America B 21(5):871-892, May 2004.

Shin et al., "Arrayed Waveguide Collimator for Integrating Free-Space Optics on Polymer Waveguide Devices," Optics Express 22(20):23801-23806, Oct. 6, 2014.

Yoshimoto et al., "Highly Efficient Coupling Semiconductor Spot-Size Converter with an InP/InAlAs Multiple-Quantum-Well Core," Applied Optics 34(6):1007-1014, Feb. 20, 1995.

* cited by examiner

SOLID-STATE OPTICAL AMPLIFIER HAVING AN ACTIVE CORE AND DOPED CLADDING IN A SINGLE CHIP

BACKGROUND

The following is related generally to the optical components used in optical communication networks, and specifically to optical devices that can amplify optical signals.

Erbium-Doped Fiber Amplifiers (EDFAs) or Praseodymium-doped fiber Amplifiers (PDFAs) are widely deployed in optical networks, in the 1550 nm or 1310 nm wavelength windows, respectively. FIG. 1 illustrates the multiple optical components that are typically included in a prior art EDFA or PDFA. The optical power from the pump laser light source 102 is combined with the input signal 101, by a wavelength-division multiplexing (WDM) coupler 104. The combined input signal and pump laser light then passes through a section of fiber 103 that has been doped with erbium or praseodymium ions in its core. The pump laser light excites the erbium or praseodymium ions embedded in the erbium-doped (or praseodymium-doped) fiber 103 to a higher energy level. The optical input signal 101 then induces stimulated emission and is therefore amplified to create the output signal. However, amplified spontaneous emission (ASE) noise is also generated simultaneously, and creates noise on top of the amplified input signal 101. Thus the output signal 106 consists of an amplified input signal, as well as the ASE noise component. An isolator 105 is located after the erbium-doped or praseodymium-doped fiber 103. This isolator 105 is intended to prevent the back scattering power out of the downstream optical fiber and other components from re-entering the EDFA or PDFA. This unwanted back scattering power would otherwise be amplified, and would therefore interfere with the EDFA's (or PDFA's) normal characteristics and performance. Also shown in FIG. 1 is a pump laser monitoring port 107.

FIG. 2A illustrates the principle of operation of an Erbium-Doped Fiber Amplifier (EDFA). The figure shows three energy levels, labeled $E_0$, $E_1$, and $E_2$, of $Er^{3+}$ ions in silica glass. Each of the energy levels are split into multiple levels or bands, via the Stark splitting process, as described in "Erbium-Doped Fiber Amplifiers, Fundamentals and Technology", Chapters 8 and 9, P. C. Becker, N. A. Olsson, and J. R. Simpson, Academic Press, 1999, for example. The difference between any two of the energy levels is labeled with the wavelength (or wavelength range) of the photons that correspond to that energy level transition. The upward arrows indicate the wavelengths at which the EDFA can be pumped, in order to excite the erbium ions to the indicated higher energy level. For example, a 1480 nm pump laser can be used to excite the erbium ions from the $E_0$ level to the $E_1$ level, whose life time is very long, on the order of 10 msec, such that population inversion between the $E_0$ level and the $E_1$ level is suitable for stimulated emission. The downward arrow from $E_1$ to $E_0$ represents the wavelength range of photons emitted due to spontaneous and stimulated emission, amplifying the input signal. Because the $E_1$ and $E_0$ energy levels are split into bands, a range of wavelengths can be amplified, shown in FIG. 2 as 1520-1560 nm.

Similarly, a 980 nm pump laser can be used to excite the erbium ions from the $E_0$ level to the $E_2$ level. The ions that have been raised to the $E_2$ level quickly transition to the $E_1$ level, via a non-radiative spontaneous emission process. The transition of these ions from the $E_1$ level to the $E_0$ level results in amplification of input signals in the 1520-1560 nm range, via stimulated emission. For a variety of reasons, pumping at 980 nm is more efficient than pumping at 1480 nm.

Pump sources of wavelengths lower than 980 nm can also be used, including visible light. FIG. 2B shows a more complete view of the energy levels of $Er^{3+}$ ions. The wavelength scale corresponds to the wavelength being emitted when $Er^{3+}$ ions transit from a given energy level to the ground state. The energy level diagram illustrates that $Er^{3+}$ ions can absorb light from approximately 1500 nm, down to less than 400 nm. Lower-wavelength pump sources (i.e., lower than 980 nm) excite the erbium ions to higher energy levels than are shown in FIG. 2A, but the overall process for amplifying the input signal via stimulated emission is similar. Also, for input signals of different wavelength ranges, different rare-earth elements, or other materials, including various metals, may be used, with correspondingly different pump source requirements. For example, to amplify input signals in the 1310 nm wavelength range, praseodymium ions have energy level transitions that are in the appropriate wavelength range. Amplifying an input signal of visible light is also physically feasible, as long as the pumping wavelength is shorter than that of the input light, and suitable dopants are used. Broadband sensitizers can also be used, as an aid to the energizing of the dopant material. (More detail on broadband sensitizers can be found, for example, in "Broadband Sensitizers For Erbium-Doped Planar Optical Amplifiers: Review", A. Polman and F. van Veggel, Journal of the Optical Society of America B, Vol. 21, Iss. 5, May 2004.).

As has been occurring with cell phones, more and more components are being squeezed into individual optical modules, with the same limited volume, in order to save space, and also to upgrade the performance of network control centers. Fiber splicing between separate fiber optic components is cumbersome, and also occupies space. It is therefore highly desirable to integrate multiple optical components into a single package. Prior art EDFAs and PDFAs, as illustrated in FIG. 1, typically make use of separate WDM coupler and isolator components, and also incorporate a length of doped fiber (typically 10 to 20 meters in length) with bend radius limitations. Further, the pump laser source is either an external component, or else it must be integrated into the EDFA housing. These considerations limit the size (and cost) reductions that can be achieved with typical prior art optical amplifiers that are based on the use of doped fibers. Semiconductor optical amplifiers (SOAs) can provide size advantages, but typically have performance limitations, due to higher levels of amplified spontaneous emission (ASE) noise, as well as a variety of non-linear behaviors. It is therefore desirable for the multiple component elements of the doped fiber (or more generally, doped waveguide) optical amplifier to be physically integrated into as few components or elements as possible, but without the performance limitations of semiconductor optical amplifiers.

SUMMARY

An optical amplifier includes a substrate and an optical core formed on the substrate that provides an optical path from an optical input to an optical output. One or more light emitting structures are formed over the substrate within and/or adjacent to the optical core. One or more cladding layers are formed on the substrate within which the optical core and light emitting structure are located, the cladding layer (or layers) having an index of refraction that is lower than an index of refraction of the optical core. The one or more cladding layers are doped with one or more dopant elements or materials. Electrical contacts are connected to the light emitting structure, whereby in response to an applied voltage differential the light emitting structure illuminates at least a portion of the one or more doped cladding layers. The dopant elements or materials emit light within a first wavelength range when illuminated by the light emitting structure by light of a wavelength that is shorter than that of the first wavelength range.

In other examples, an optical amplifier includes a substrate and an optical core formed on the substrate providing an optical path from an optical input to an optical output. One or more light emitting structures is formed over the substrate within and/or adjacent to the optical core. Cladding along the optical core and light emitting structure has an index of refraction that is lower than an index of refraction of the optical core. The cladding is doped with one or more dopant elements or materials. Electrical contacts are connected to the light emitting structure, whereby in response to an applied voltage differential the light emitting structure illuminates at least a portion of the doped cladding. The dopant elements or materials emit light within a first wavelength range when illuminated by the light emitting structure by light of a wavelength that is shorter than that of the first wavelength range.

A method of forming an optical amplifier includes growing a light emitting epitaxial layer on a first substrate and forming a patterned optical core and a light emitting structure within and/or adjacent to the optical core from the light emitting epitaxial layer. One or more cladding layers are deposited on the patterned optical core. The cladding layer or layers have an index of refraction that is lower than an index of refraction of the optical core and is doped with one or more dopant elements or materials. The dopant elements or materials emit light within a first wavelength range when illuminated by light of a wavelength that is shorter than that of the first wavelength range. A first set of electrical connections contacting the light emitting structure is fabricated on the one or more cladding layers. A second substrate is formed over the first set of electrical connections and the first substrate is subsequently removed from the patterned optical core formed on it. A second set of electrical connections is fabricated over a surface exposed by removing the first substrate, the second set of electrical connections contacting the light emitting structure.

A further method of forming an optical amplifier includes growing a light emitting epitaxial layer on a first surface of a substrate and forming from the light emitting epitaxial layer a patterned optical core and a light emitting structure within and/or adjacent to the optical core. Cladding is deposited along the optical core and light emitting structure. The cladding has an index of refraction that is lower than an index of refraction of the optical core and is doped with one or more dopant elements or materials. The dopant elements or materials emit light within a first wavelength range when illuminated by light of a wavelength that is shorter than that of the first wavelength range. A first set of electrical connections is fabricated over the light emitting structure, the first set of electrical connections contacting the light emitting structure. A second set of electrical connections is fabricated on or penetrating through a second surface of the substrate, the second set of electrical connections electrically contacting the light emitting structure.

Various aspects, advantages, features and embodiments are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

The techniques described in the following provide for the multiple component elements of a doped fiber (or more generally, doped waveguide) optical amplifier to be physically integrated as a single optical amplifier chip, but without the performance limitations of semiconductor optical amplifiers.

Figure 1:
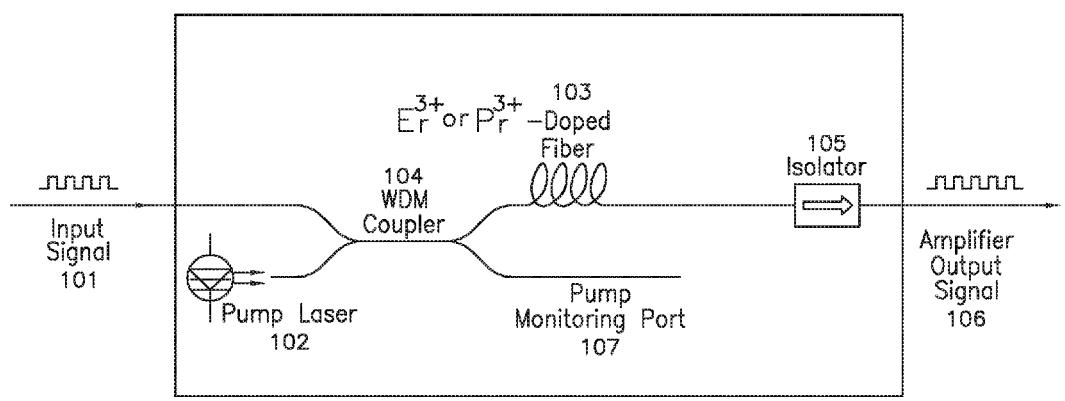
FIG. 1 illustrates an Erbium-Doped (or Praseodymium-Doped) Fiber Amplifier (EDFA or PDFA, respectively), used to amplify an optical signal.
Figure 2A:
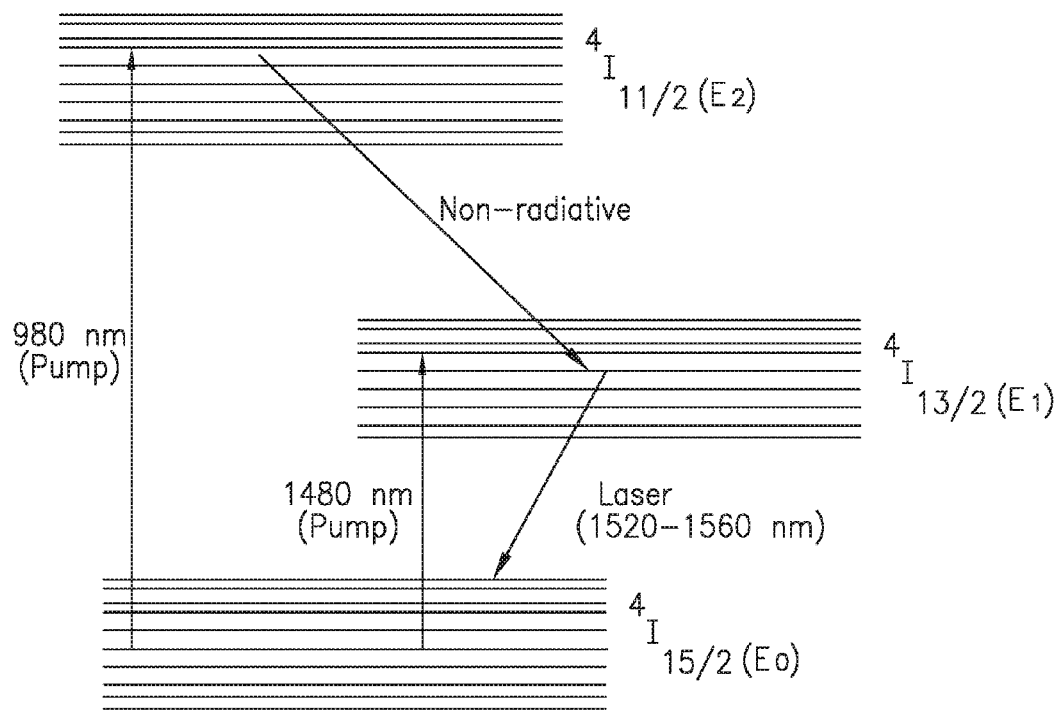
FIG. 2A illustrates the principles of operation of an Erbium-Doped Fiber Amplifier (EDFA).
Figure 2B:
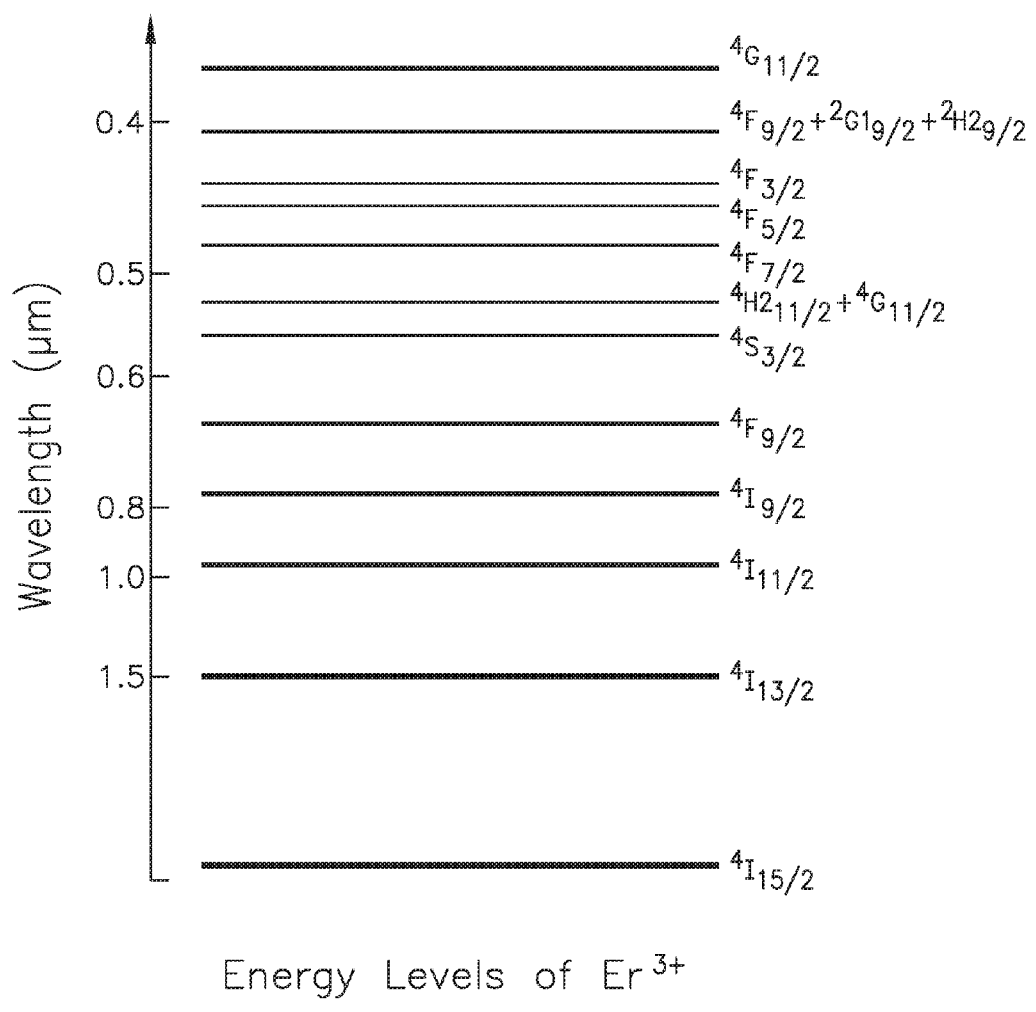
FIG. 2B shows a more complete view of the energy levels of $Er^{3+}$ ions.
Figure 3A:
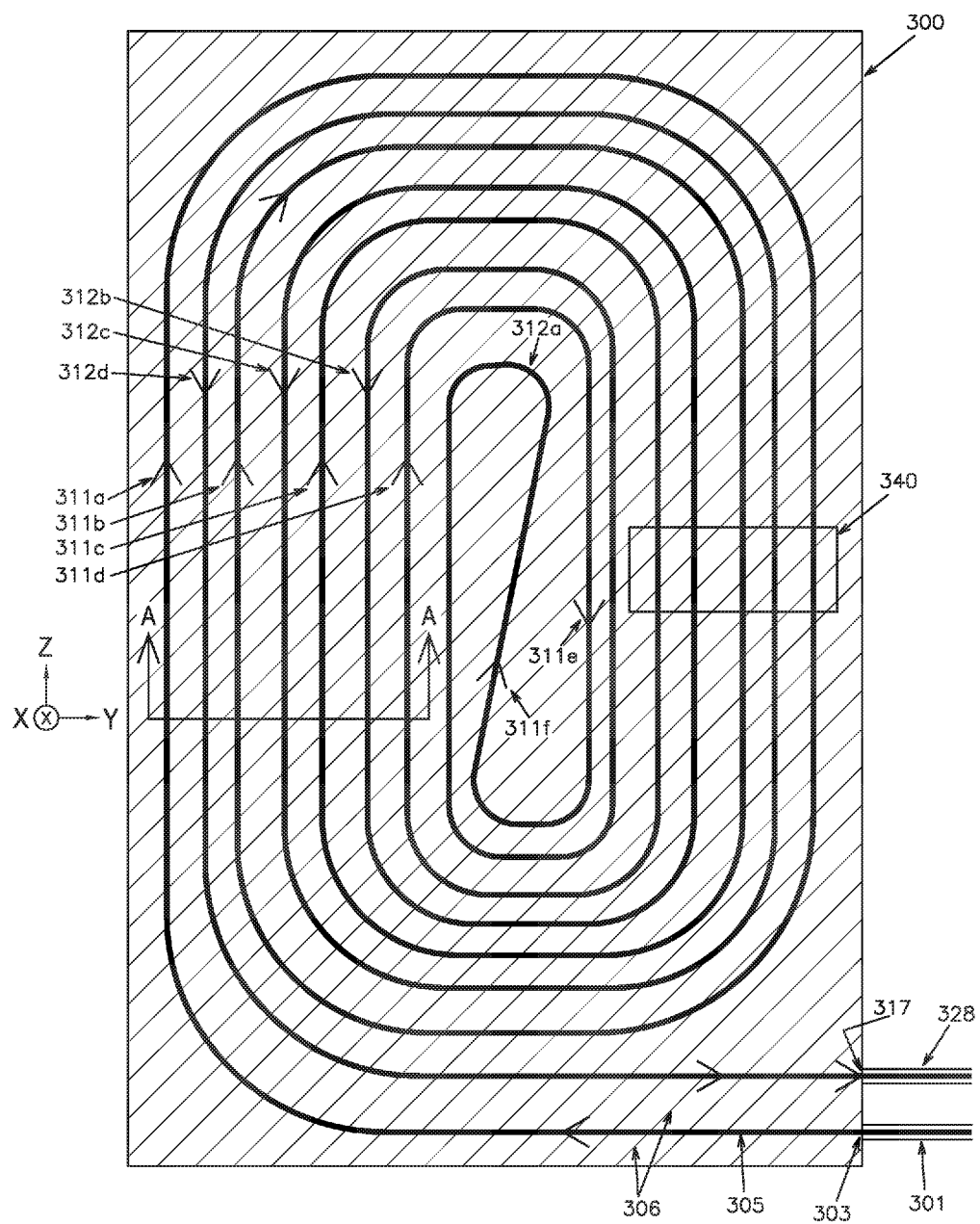
FIG. 3A shows the waveguide layout and routing of one embodiment.

FIG. 3A illustrates a first set of exemplary embodiments that have an active core 305 that emits pump light and also acts as a waveguide core for the input signal, with the active core being embedded within a cladding that has been doped with a rare-earth element, or another suitable dopant material. The input signal is being carried by an input optical fiber 301, and is coupled to an end edge 303 of a planar waveguide that is formed by an active core 305 and its surrounding cladding 306. The active core 305 has a light emitting structure such as a Light Emitting Diode (LED) epitaxial structure within, based on materials such as InGaAsP, InGaAs or InGaN compound semiconductor materials (as described below), whose index of refraction (about 2.1 to 3.8) is generally higher than that of the cladding 306. (The following description will refer to LED embodiments for simplicity, but, more generally, this can be taken more generally as a light emitting structure.) The cladding 306 is doped with a rare-earth element such as Erbium, Praseodymium, Thulium, Ytterbium, Neodymium, or their combinations. The dopant material may also be a metal, or some other material that can emit light at the appropriate wavelength or wavelength range. The total thickness (marked by T in FIG. 4) of all epitaxial layers in the active core 305 is a few microns. Erbium is used as an example of the doped rare-earth element in the following description, without losing its generality and applicability to other rare-earth elements, or to other dopant materials. More generally, the cladding's dopant elements or materials are chosen to emit light within a first wavelength range when illuminated by the LED or other light emitting structure, by light of a wavelength that is shorter than that of the first wavelength range, where in many common applications the first wavelength range is a subset of the range of 400 nm to 3,000 nm. Although erbium is used in much of the following discussion as a representative dopant material, other dopant materials are within the scope of the present invention, including, but not limited to, other rare-earth elements and other metals.

As shown in the example of FIG. 3A, the active core 305 is looped in a clockwise direction, through a substantial number of turns, as indicated by arrows 311a through 311f, within a planar chip 300. The active core 305 then makes a reversing turn at 312a, and then progresses through a series of counter-clockwise loops, as indicated by arrows 312b through 312d, until it reaches its end point at the chip edge 317, which is coupled to an output optical fiber 328. The total effective length of the active core may be as long as tens of centimeters, or even ten meters. Because the Refraction Index (RI) of the active core 305 is higher (either significantly higher or just slightly higher) than that of the cladding 306 (the cladding index typically ranging from about 1.45 to about 2.01), the optical power is confined within the active core 305. The active core 305 has cross-sectional dimensions on the order of one micron, or even sub-micron, for operating wavelengths from 1300 to 1600 nm. The dimensions of the active core 305 along the path of its loops can vary, based on the demands and requirements for effective optical power confinement. For instance, stronger power confinement is needed at a sharp turn such as 312a, and thus the core dimensions should be slightly larger there. In the straight sections, as indicated by 311a through 311d, it is desirable for more optical power to be spread from the active core 305 into the cladding 306 to induce stimulated emission of the erbium ions embedded there (as explained later), and thus the width (marked by W in FIG. 4) of the active cores 401 through 407 should be smaller, down to sub-micron.

Figure 4:
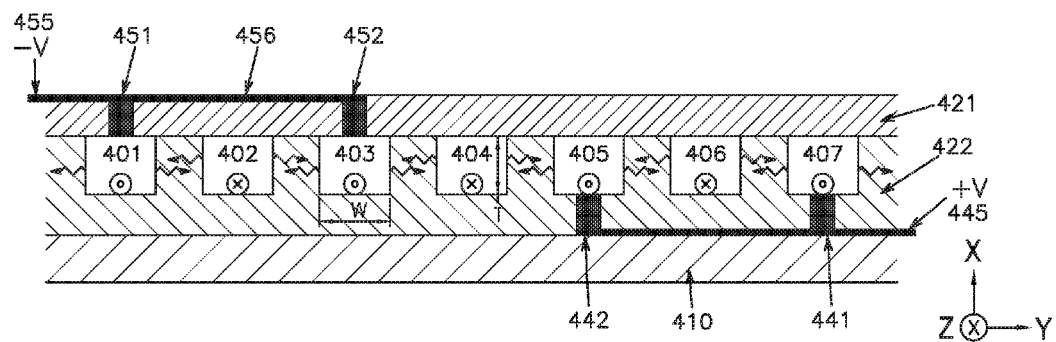
FIG. 4 shows a cross-section view of the embodiment shown in FIG. 3A.

FIG. 4 shows a cross-section view of the embodiment of FIG. 3A, taken at the A-A "cut line". The active core (305) loops of FIG. 3A are shown in FIG. 4 as cross-sections 401 through 407, and the surrounding cladding 306 of FIG. 3A is shown by 421 and 422 in FIG. 4. The thin layer or layers composed of the active core and the cladding is bonded to a substrate 410 (as explained later in the description of the fabrication method). Positive "point contact" electrodes, as exemplified by 441 and 442, are dispersively deposited onto the p-side of the active LED core loop 305, and are interconnected to a positive terminal electrode 445 for supplying positive voltage to the active LED core loop 305. Similarly, negative "point contact" electrodes, as exemplified by 451 and 452, are dispersively deposited onto the n-side of the active LED core loop 305, and are interconnected to negative terminal electrode 455, to supply a negative voltage to the active LED core loop 305.

The cross-sections of active cores 401 through 407 are surrounded by an upper cladding 421 and a lower cladding 422, which are comprised of a host material (preferably in an amorphous state or nano-clustering state), such as $SiO_2$ (RI about 1.45), silicon-rich $SiO_x$ having Si nanocrystals within as broadband sensitizers, $SiO_xN_y$ (RI ranging from about 1.45 to about 2.01), or even polymers, doped with erbium ions (or other rare-earth ions). The Refraction Index (RI) of the cladding material can therefore range from about 1.45 to about 2.01. The active cores 401 through 407 emit pump light at a wavelength that is around 980 nm or 1480 nm, or another wavelength in the visible light and ultraviolet (UV) ranges that will excite $Er^{3+}$ ions (or other dopant materials) embedded in the silica (or $SiO_xN_y$) host material. Visible wavelengths as well as near-infrared and UV wavelengths are also feasible as long as they can pump the $Er^{3+}$ ions (or other dopant materials) to the desired energy levels. In the case where the pumping wavelength is much shorter than the signal wavelength, broadband sensitizers may be required, to be embedded (or to co-exist) with the optically active dopant material within the cladding, in order to enhance the emissions from the optically active dopants. (See, for example, in "Broadband Sensitizers For Erbium-Doped Planar Optical Amplifiers: Review", A. Polman and F. van Veggel, Journal of the Optical Society of America B, Vol. 21, Iss. 5, May 2004.) If other rare-earth elements or other dopants are used, for amplification of different input signal wavelengths, then the pump light wavelength must be compatible with the type of dopant used, as well as the intended input signal wavelength range. Furthermore, amplifying an input signal of visible light is also physically feasible, as long as the pumping wavelength is significantly shorter than that of the input light and suitable dopants as well as sensitizers are used in the cladding.

The active core can be composed of direct bandgap semiconductor materials such as III-V compound semiconductors, including InGaAs (RI of about 3.4), InGaAsP (RI of about 3.6), InGaN and AlInGaN (RI of about 2.1), or other semiconductor materials that have a direct bandgap for efficient light emission. Thus, the RI of the cladding material can generally range from about 1.45 to about 2.01, while the RI of the active core can generally range from about 2.1 to about 3.8. Through proper selection of the active core material and the cladding material, both high index-contrast waveguides (with strong confinement) and low index-contrast waveguides (with weak confinement) can be constructed.

The input signal light propagating along the active core loop 305 in FIG. 3A forms a fundamental mode, with its evanescent field penetrating into the cladding 306 to induce stimulated emission of the excited $Er^{3+}$ ions in the cladding, such that the stimulated emission photons are coupled back into the active core loop 305, amplifying the fundamental mode. Because the photon energy of the signal light is less than the bandgap energy of the LED's quantum well (QW)

material, or the active layers in a hetero-junction LED structure, the absorption loss of signal light in the active core 305 is negligible. Furthermore, optical loss caused by the cladding is very low, because the dielectric cladding has very little absorption of the input signal light, as well as the pump light.

Figure 5:
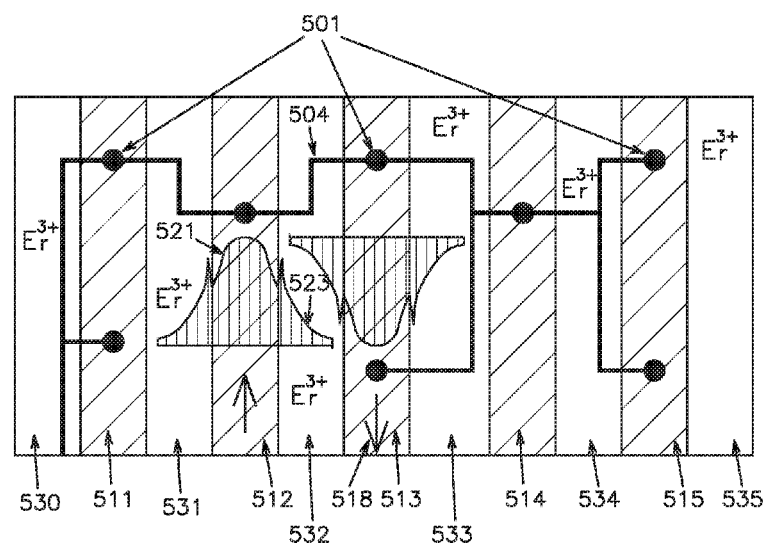
FIG. 5 shows an enlarged view of one portion of the embodiment shown in FIG. 3A.

FIG. 5 is an enlarged view of inset 340 from FIG. 3A. Negative electrodes 501 are dispersed on the top of the active core sections 511 through 515, and are electrically interconnected by conductive trace 504. The cladding sections 530 through 535 are interleaved into the core array formed by core sections 511 through 515. The up-arrow shown in active core section 512 and the down-arrow shown in active core section 513 indicate the direction of signal light propagation as an illustration. The electrical field distribution 521 of the fundamental mode propagating in active core section 512 has the majority of its optical power confined in the core, but its evanescent field 523 penetrates into the cladding 532, to induce stimulated emission of the excited $Er^{3+}$ ions, thus enhancing its field strength. The signal light that propagates in the downward direction (as indicated by arrow 518) in active core section 513 will do the same. Because the index of the cladding material is lower than that of the active core, the coupling of Amplified Spontaneous Emission (ASE) noise from the erbium ions in the cladding into the fundamental mode is very limited.

Figure 6A:
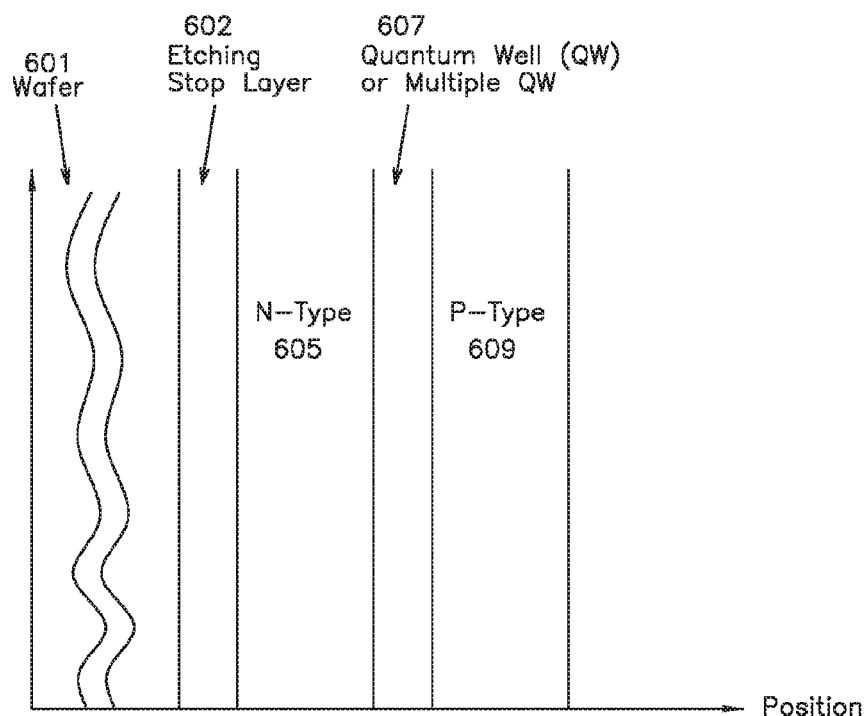
FIG. 6A shows typical LED epitaxial structure.
Figure 6B:
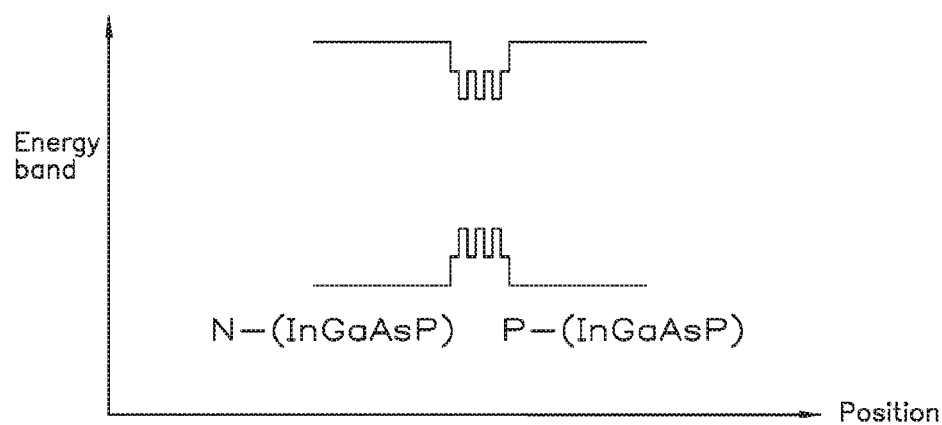
FIG. 6B illustrates the energy bands of the LED epitaxial structure shown in FIG. 6A.

FIGS. 6A and 6B illustrate one example of a typical LED epitaxial structure and its corresponding energy bands. (In these figures, the Position axes correspond to downward in FIG. 3B or 4, and the upward axis in FIG. 6A corresponds to a lateral direction.) In FIG. 6A, an etching stop layer 602 having a composition such as InGaP is initially grown using Metal-Organic Chemical Vapor Deposition (MOCVD) or Molecular Beam Epitaxy (MBE), on the top of a wafer substrate 601. Then an N-type compound semiconductor layer 605 is grown, followed by a quantum well (QW) or multiple QW layer 607. Finally, a P-type layer 609 is added on top of the QW layer 607. Depending on the desired emission wavelength, the composition of the compound material is chosen. For emission around 980 nm, QW compound material having a composition of $(In_x Ga_{1-x})_{0.5} As_{0.5}$ is selected, and a compound of composition $(In_x Ga_{1-x})_{0.5}(As_y P_{1-y})_{0.5}$ is chosen for 1480 nm emission. For lower wavelength pump light, AlInGaP can be used for 630 nm emission, InGaN can be used for emission in the 420 nm to 480 nm range, and AlInGaN can be used for emission in the 370 nm to 420 nm range. (For more detail refer, for example, to Chapter 1 of "Diode Lasers and Photonic Integrated Circuits", L. Coldren, S. Corzine, and M. Mashanovitch, $2^{nd}$ Edition, Wiley Publishing, 2012, and Chapter 4 of "Introduction to Solid-State Lighting", A. Zukauskas, M. Shur, and R. Gaska, Wiley Publishing, 2002.) FIG. 6B shows the corresponding energy band gap of the epitaxial structure illustrated in FIG. 6A. Modern multiple-QW LEDs have high quantum efficiency of emission in the visible light range, between 65% and 95%.

Figure 3B:
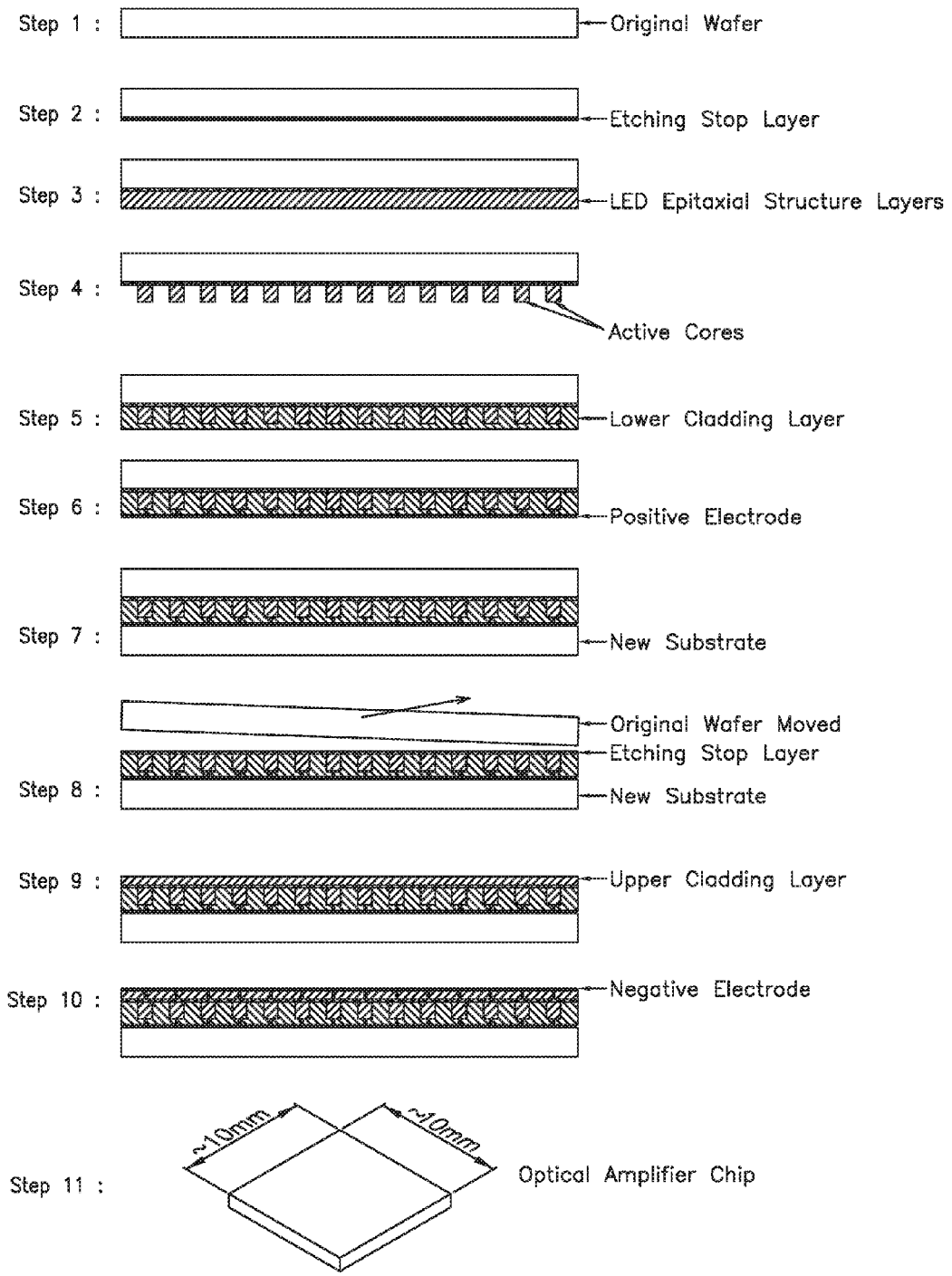
FIG. 3B illustrates an exemplary process for the fabrication of the embodiment such as shown in FIG. 3A.

In order to fabricate the material structure of the embodiments such as those shown in FIGS. 3A, 4, and 5, an exemplary sequence of fabrication processes is illustrated in FIG. 3B:

1. Select a semiconductor wafer such as GaAs, which has a lattice constant that is similar to the subsequent epitaxial layers.
2. Grow an etching stop layer having a composition such as InGaP, onto the wafer, by either Metal-Organic Chemical Vapor Deposition (MOCVD) or Molecular Beam Epitaxy (MBE).
3. Then grow, via sequential MOCVD or MBE processes, an LED epitaxial structure (about 1 to 4 microns in total thickness). One example of a typical LED structure is illustrated in FIG. 6A.
4. Use photolithography and then chemical vapor etching or wet etching to create a spiral active core loop 305, indicated in FIGS. 3A, 4, and 5.
5. Utilize either chemical vapor deposition or physical sputtering to deposit an erbium-doped SiO2 layer (with thickness of about 10 microns), shown as the lower cladding layer or layers 422 in FIG. 4, on the top of the patterned active core loop.
6. Fabricate the positive electrodes, extending through the lower cladding to contact the p-side of the active core loop, using a sequence of lithography, etching, and metal deposition. Metal traces are used to interconnect all of the positive electrodes. Since these metal traces can dissipate optical power, their width should be minimized.
7. Either epoxy or metallurgically bond a new substrate, which has a thermal expansion coefficient close to those of the cladding and active core (semiconductor wafers are preferred), to the lower cladding. The new substrate may be of an electrically conductive or non-conductive material.
8. Use wet chemical etching to remove the original wafer (GaAs in this example, as described in step 1, above), until the etching is stopped at the etching stop layer indicated in step 2.
9. Deposit the top or upper erbium-doped cladding layer or layers 421 (as shown in FIG. 4), using the same process as indicated in step 5.
10. Create the negative electrodes and their electrical interconnections for the n-side LED active core, using similar processes as indicated in step 6.
11. Dice the finished wafer into individual optical amplifier chips, which have dimensions of about 10 mm×10 mm.

The sequence processing sequence and recited details of FIG. 3B is meant as an exemplary process and not meant to be exhaustive of the possible variations. It should be noted that although referred to in FIG. 3B (and also below in FIG. 11B) as "steps" for expository purposes, in actual processing any of these listed process phases may involve multiple sub-steps or, conversely, several "steps" may be combined in a single processing operation, so that "step" in not meant to be limiting on how the process is performed in practice.

Figure 7:
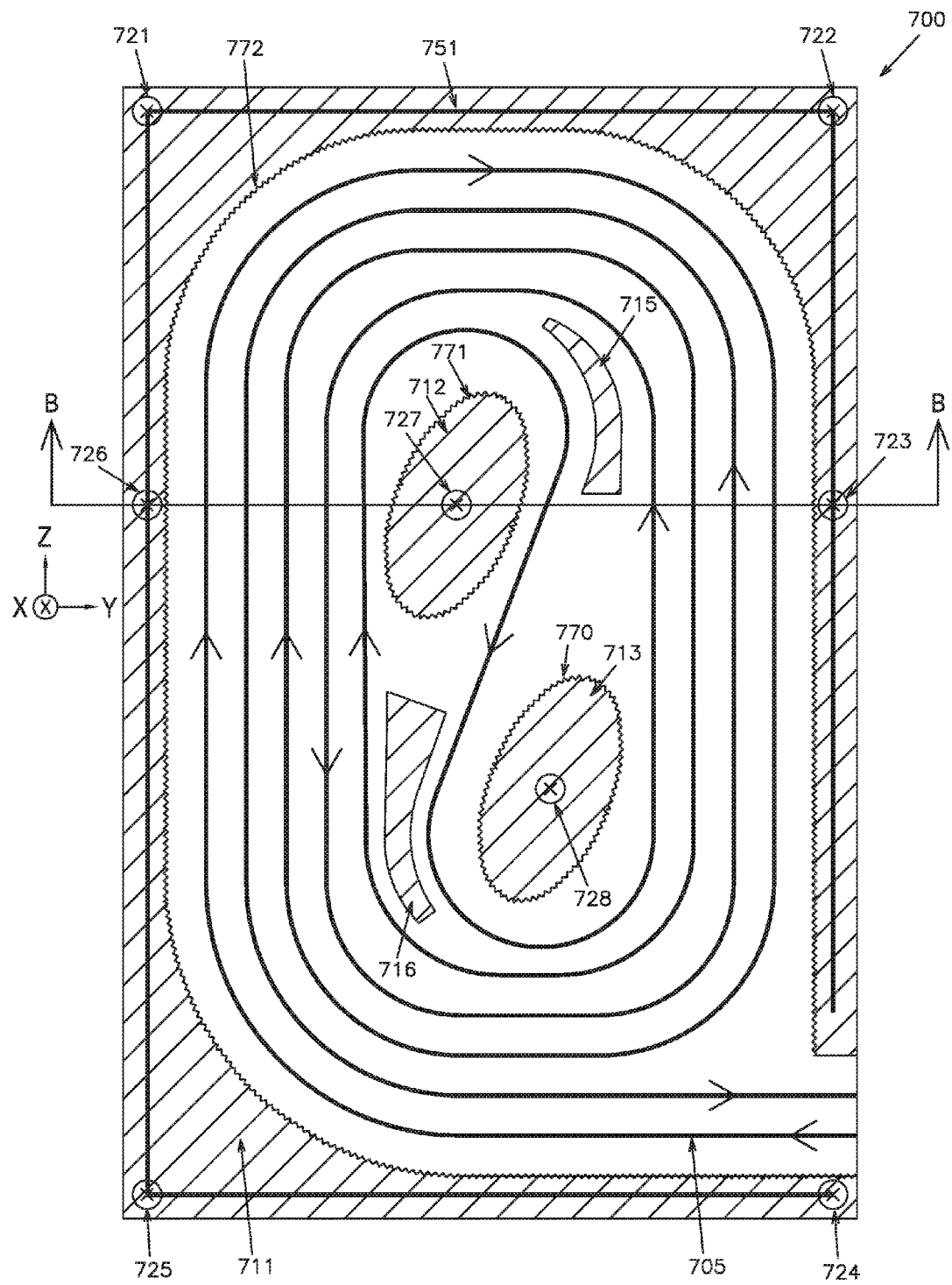
FIG. 7 shows another embodiment, with light-emitting regions surrounding and interspersed with the waveguides.

In practice, the fabrication of the positive and negative "point contact" electrodes, so that they adhere properly to the narrow active core loop 305, through cladding layer 306 (as shown in FIG. 3A, and also shown in more detail in FIGS. 4 and 5), is feasible but may be challenging in some process flows. FIG. 7 illustrates another set of embodiments that avoids "point contact" electrodes, with its emitting region and the waveguide core being defined or created from the same LED epitaxial structure, fabricated from a wafer. Firstly, the core loop 705 and pump emission regions (as indicated by hatched areas 711, 712 and 713, for example) are created from a planar LED epitaxial structure. (The non-hatched areas are here covered by cladding, as indicated by reference numbers 814 and 816 in FIG. 8.) Electrode pads 721 through 728 are fabricated on top of the pump emission regions 711, 712, and 713, respectively, for electrical wire bonding. The interconnecting metal section, or trace (shown as 751 in the figure), is intended to ensure effective current spreading over the emission region 711. Then the erbium-doped cladding is deposited to enclose the core loop 705, excluding the pump emission regions 711, 712, and 713. The emission regions can be interposed within the core loops as well or arranged arbitrarily (for example, emission regions 715 and 716) as long as they are in close proximity to the cladding area, for good coupling of the pump light. Because the pump emission photons have energies that are not more than the bandgap energy of the LED structure within the core 705, absorption by the core is limited. Therefore the pump photons can come across or traverse the core several times before they reach the cladding areas which are located farther away from the emission regions. If some photons are absorbed by the core 705, then they are likely to be "recycled", to be re-emitted from the core. In order to maximize the extraction of pump light from the pump emission regions, the interface between the emission regions and the cladding areas may be shaped or textured, or given a structure, as depicted graphically by items 770, 771, and 772.

Figure 8:
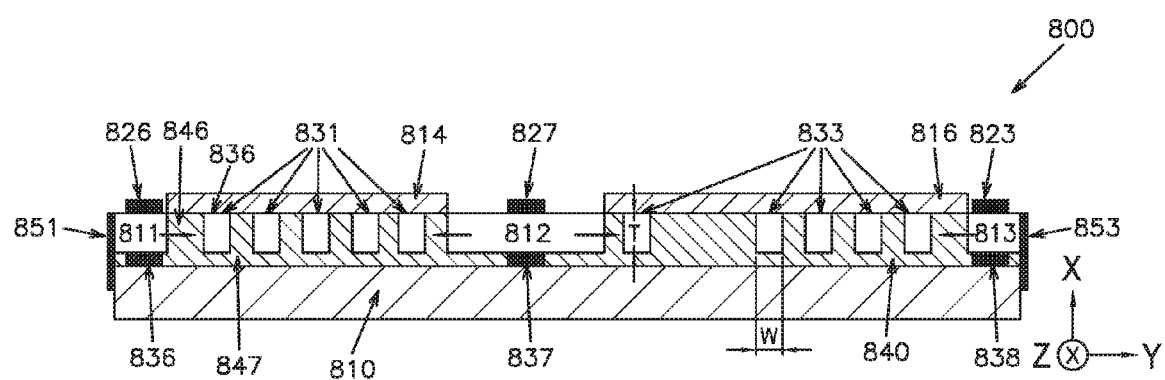
FIG. 8 shows a cross-section view of the embodiment shown in FIG. 7.

FIG. 8 is a cross-section view from FIG. 7, taken at the B-B cut line. Items 831 and 833 indicate the multiple core cross-sections, and items 814 and 816 are their corresponding top-side erbium-doped claddings, situated on top of core sections 831 and 833. The pump emission regions are indicated by 811, 812, and 813, and their corresponding top-side electrode pads are indicated by 826, 827, and 823, respectively. Their bottom-side electrode pads are indicated by 836, 837, and 838, respectively. The lower cladding layer 840 is bonded to a substrate 810. Pump light emitted from emission region 811 first enters the cladding layer at the location indicated by 846, to excite the erbium ions within. The unabsorbed photons then penetrate the next core 836 to reach the next section of the cladding layer 847, and so on. Pump emissions from the other two emission regions 812 and 813 behave in similar fashion. Mirrors or reflective coatings 851 and 853 may be applied to the outer edges of emission regions 811 and 813, respectively, to prevent pump light from leaking out of the amplifier chip 800.

The fabrication processes for the embodiments illustrated in FIGS. 7 and 8 can be similar to the processes described above for the embodiments illustrated in FIGS. 3A, 4, and 5, and as illustrated in FIG. 3B.

Figure 9:
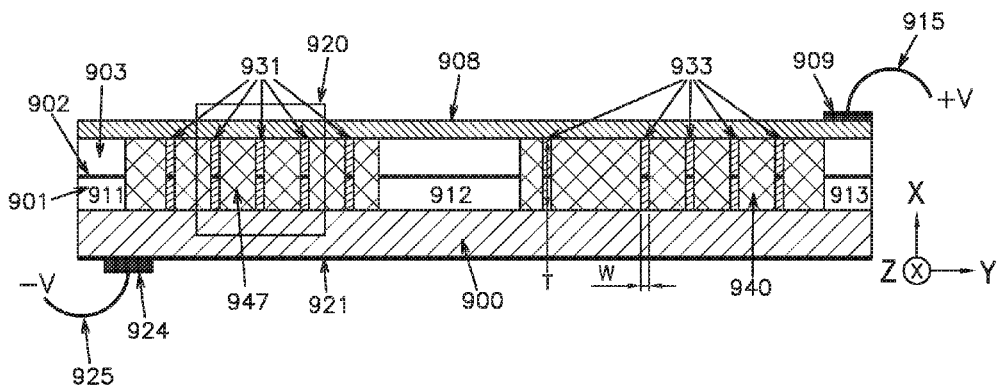
FIG. 9 shows a cross-section view of an additional embodiment, as also shown in FIG. 11A, incorporating LED epitaxial structures within the waveguide core(s).
Figure 10:
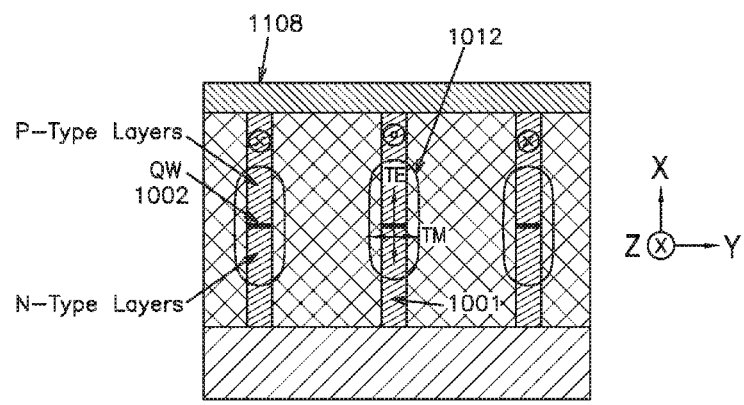
FIG. 10 shows an enlarged view of one portion of the embodiment shown in FIG. 9.
Figure 11A:
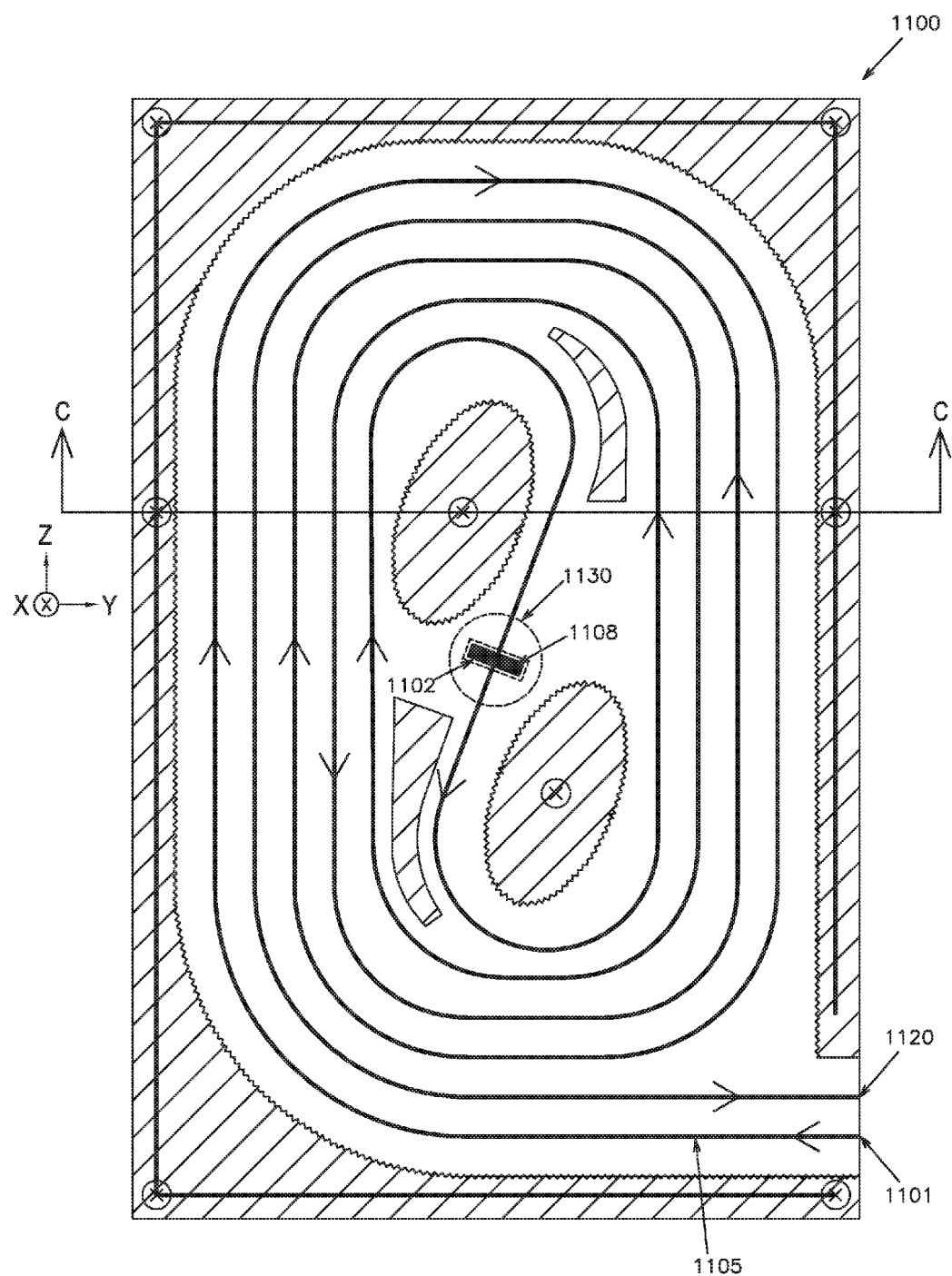
FIG. 11A shows a top view of the embodiment shown in FIG. 9, depicting the waveguide layout and routing, as well as the inclusion of a wave plate.

FIGS. 9 and 11A show yet another set of embodiments, which can also help to avoid the fabrication difficulties associated with the use of "point-contact" electrodes. FIG. 11A shows the top view of optical amplifier chip 1100, and FIG. 9 is a cross-section view, taken at the C-C cut line of FIG. 11A. FIG. 10 is an enlarged view of inset 920 from FIG. 9. As also shown in FIGS. 4 and 8, T represents the total thickness of the LED epitaxial layers, and W is the width of the active waveguide cores. Typically T is on the order of a few microns, and W is about one micron. Thus T/W (referred to as the aspect ratio) is therefore on the order one, or slightly larger. However, in the embodiment shown in FIGS. 9, 10, and 11A, T is about 5 to 10 microns and W is about 1 micron or sub-micron. The total thickness T includes N-type epitaxial layers 901 grown from, or on top of the original wafer substrate 900 (as explained in the description of fabrication processes, below), the light-emitting quantum well or active layers in the hetero-junction LED structure represented by 902, and the P-type layers 903, as well as the corresponding layers within the active cores 931 and 932. Thus T is typically one order of magnitude larger than W, resulting in the aspect ratio being on the order of ten. Furthermore, based on the refraction index for typical LED structure layers, the index of the QW is generally the highest index within the structure, and the index decreases with distance from the QW. Thus there is a weak optical confinement toward the QW layer. With this sort of geometry and index distribution, the active cores 931 and 933 and their respective claddings 947 and 940, act like slab waveguides, which have a power density distribution of the fundamental mode in an elliptic shape, as depicted graphically by item 1012 in FIG. 10. The power density distribution has its peak power point aligned with the QW 1002, with its long axis lying along the active core slab 1001 (i.e., the X-axis shown in FIG. 10).

Note that in FIGS. 9 and 10, the N-type epitaxial layers represented by 901, and the lower half of the active cores 931 and 933, have been grown or formed on top of the substrate 900. The substrate material may be either electrically conductive or non-conductive. If the substrate 900 is electrically conductive, then the electrical connections to the N-type epitaxial layers may be made to the back side of the substrate, as shown in FIG. 9. However, if the substrate 900 is non-conductive, then it will be necessary to use an etching process (or some other appropriate process) to create vias or through-holes that pass through the substrate material, in order to establish electrical connections to the lower side of the N-type epitaxial layers.

The power distribution 1012 of the fundamental mode can be said to carry two electric polarizations, referred to as the TE mode (the electric field primarily along the X-axis of FIG. 10) and the TM mode (the electric field primarily along the Y-axis). It is to be expected that the coupling coefficients of stimulated emission from the erbium ions in the cladding layers 947 and 940, into the active cores 931 and 933, will be slightly different between the TE mode and the TM mode. The gains (in optical amplification) for the TE mode and the TM mode are thus slightly different as well. The amplification therefore has a polarization dependency, which could be a negative effect for many applications. To remedy this, as shown in FIG. 11A, a 180-degree phase shift (also referred to as a half-wavelength shift) wave plate 1108 may be inserted into a slot 1102, that has been added at approximately the middle point of the core loop 1105. Thus, a signal that enters the optical amplifier chip at the input port 1101, and is amplified as it propagates to the output port 1120, will have its two polarizations "swapped" for the second half of the amplification loop (i.e., from the wave plate 1108 to the output port 1120). The exact position of the wave plate 1108 along the core loop 1105 can be optimized to minimize the polarization dependence of the optical amplifier chip 1100. Additionally, a wave plate may similarly be introduced into other embodiments described here as needed or desired.

Figure 12A:
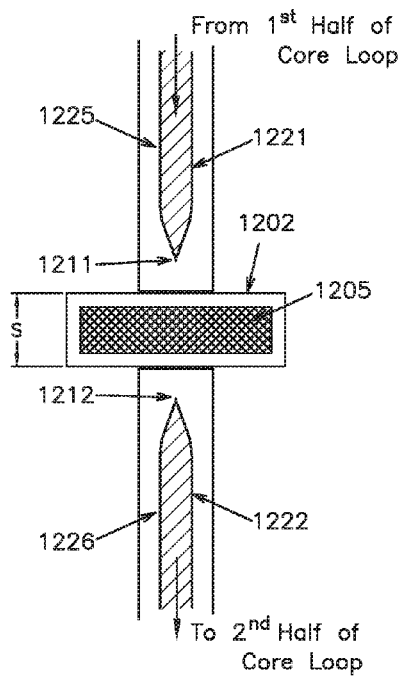
FIG. 12A shows a detailed view of the wave plate such as can be used in embodiments like those shown in FIG. 11A, including the coupling of light from and to the adjacent waveguides.

Although the wave plate 1108 is only a few hundred microns in thickness, it causes coupling loss between the incoming waveguide and the outgoing waveguide as shown in FIG. 12A, which is an enlarged view of the inset 1130 from FIG. 11A. As illustrated in FIG. 12A, the coupling loss can be reduced by modifying the waveguide geometry on either side of wave plate 1108 (shown in FIG. 12A as item 1205). In the embodiment shown in FIG. 12A, tapering the waveguide core-ends 1211 and 1212 of the incoming waveguide 1221 and the outgoing wave guide 1222, respectively, results in the coupling loss being less sensitive to the axial distance (marked by s) of the slot 1202 of the wave plate 1205, between the two waveguide ends 1211 and 1212 (refer, for example, to "Highly Efficient Coupling Semiconductor Spot-Size Converter with an InP/InAlAs Multiple-Quantum-Well Core", N. Yoshimoto, et al., Applied Optics, Vol. 34, No. 6, February 1995). The cladding material that lies between the tapered waveguide core ends 1211 and 1212, and the wave plate 1205, improves the coupling of light into and out of the wave plate. Other beam expansion methods for waveguide modes (refer, for example, to "Arrayed Waveguide Collimator for Integrating Free-Space Optics on Polymer Waveguide Devices", J. S. Shin, et al., Optics Express 23801, Vol. 22, No. 20, October 2014), prior to entering the wave plate 1205, are also within the scope of the present embodiments.

Figure 12B:
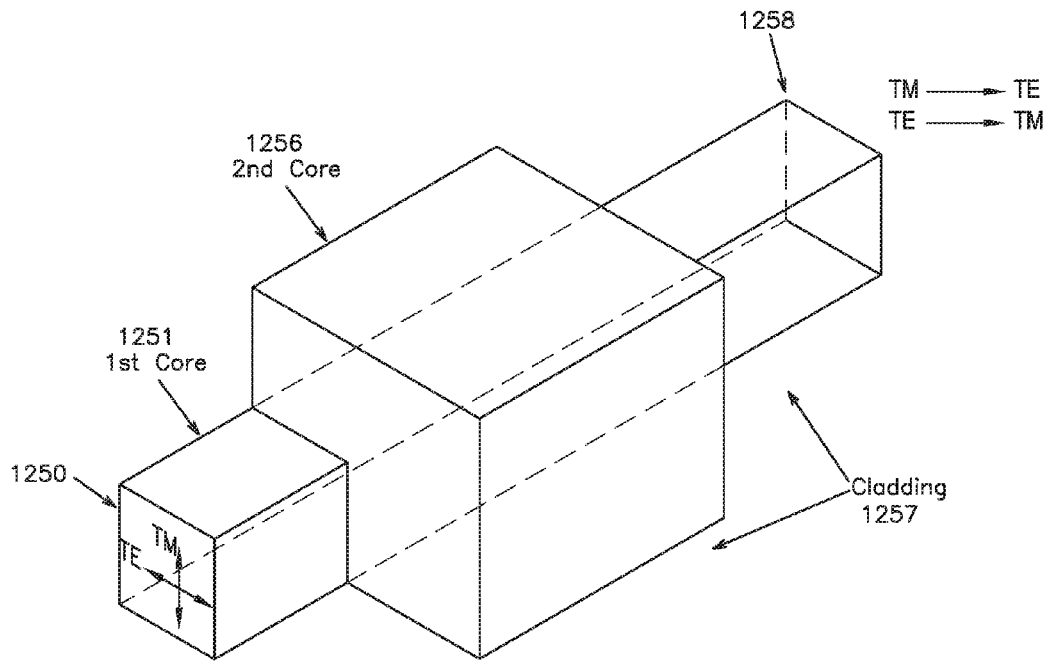
FIG. 12B illustrates use of a polarization rotator, utilizing an offset two-core structure, surrounded by a common cladding.

FIG. 12B shows an example (see "Silicon Photonic Circuit with Polarization Diversity", H. Fukuda, et al., Optics Express 4872, Vol. 16, No. 7, March 2008) illustrating an embodiment of a polarization rotator, utilizing an off-set two-core structure, surrounded by a common cladding 1257. An input signal with random polarization, having been launched into the input port 1250 of the first core 1251, is coupled into two modes, denoted by TE and TM. Each mode is rotated by birefringence as it passes through the second core, which has a refraction index (RI) that is less than that of the first core. Given a proper length of the second core 1256, the TE mode is rotated to the TM mode, and the TM mode is rotated to the TE mode, at the output port 1258 of the first core 1251. A polarization rotator such as the prior art embodiment shown in FIG. 12B can be used to replace the wave plate structure illustrated in FIGS. 11A and 12A.

Figure 13:
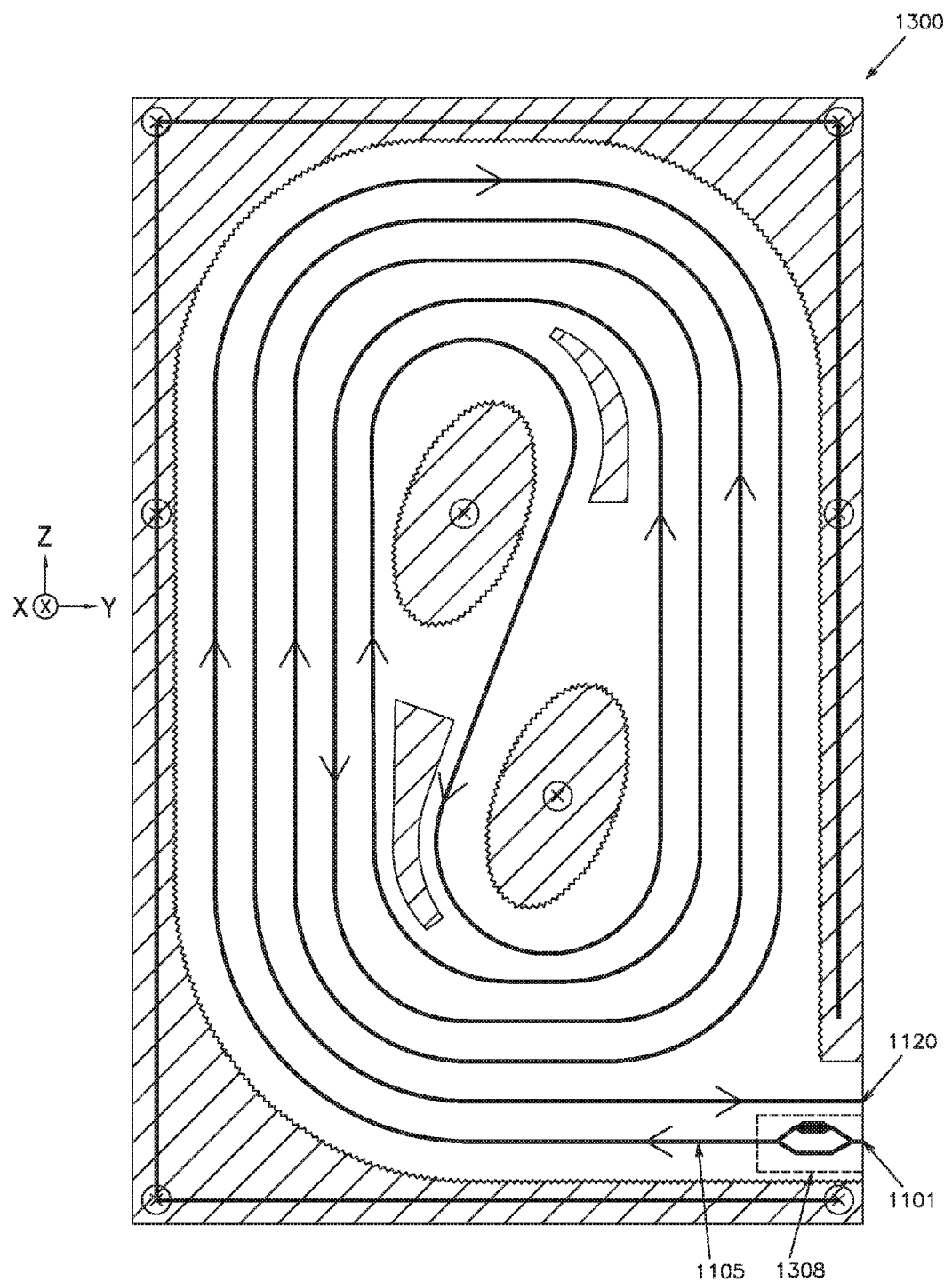
FIG. 13 shows another embodiment, utilizing a polarization rotator at the input port, for reducing polarization dependent loss.
Figure 14:
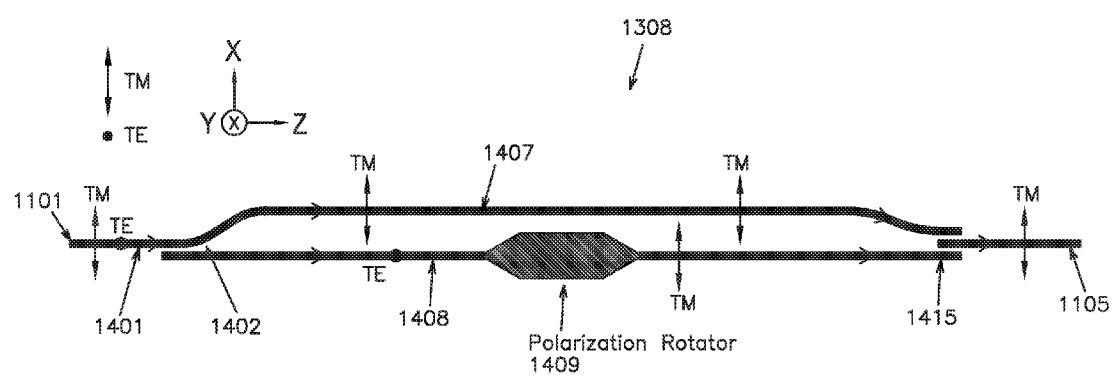
FIG. 14 provides a perspective view of a polarization rotator such as is used in the embodiment shown in FIG. 13.

FIGS. 13 and 14 show another set of embodiments, utilizing another method for managing the polarization dependence of the optical amplifier chip 1100 that was described above, and shown in FIG. 11A (as well as FIGS. 9 and 10). FIG. 13 is identical to FIG. 11A, except that the wave plate 1108 in FIG. 11A is eliminated, and instead a polarization uniting or combining structure 1308 is added between the input port 1101 and the beginning of the active core loop 1105, where such a polarization uniting or combining structure can similarly be used in other embodiments presented here as needed or desired. (A top view of the polarization uniter 1308 is shown in FIG. 14. Signal light that is launched into the input port 1101 can be decomposed into two polarization modes, a TE-like mode (electric field primarily along the y-axis) and a TM-like mode (electric field primarily along the x-axis)). Both modes propagate along the waveguide section 1401 until they are split by a polarization splitter 1402 into two paths 1407 (carrying the TM mode) and 1408 (carrying the TE mode). The TE mode is converted to a TM mode by a polarization rotator 1409, as exemplified by FIG. 12B. Then the two TM modes in paths 1407 and 1408, respectively, are combined by a coupler 1415, and coupled into the beginning of active core loop 1105. Thus, only the TM mode propagates and is amplified through the full active core loop 1105. In similar fashion, the polarization uniter 1308 can also be used to convert an input signal with random polarization, into a signal that carries primarily a TE mode.

The embodiments shown in FIGS. 9, 10, and 11A, as well as the similar embodiment shown in FIGS. 13 and 14, include LED (or, more generally, other light emitting structure) emitting regions, similar to the LED emitting regions shown in the embodiment of FIGS. 7 and 8. It is worth mentioning that these LED emitting regions 911, 912 and 913 (as shown in FIG. 9) are used to increase the pump power, but they can be eliminated (as in the embodiment shown in FIG. 3A), since now the active cores 931 and 933 emit by themselves. In the embodiment of FIGS. 9, 10, and 11A (as well as the embodiment of FIGS. 13 and 14), the positive current spreading metal layer 908 can therefore be directly deposited on top of the P-type layers of the LED structure(s), including active cores 931 and 933 and LED emitting regions 911, 912 and 913. The current spreading layer 908 may also be applied on top of the cladding areas. Since this current spreading layer 908 is relatively far away from the power distribution of the fundamental mode, it doesn't appreciably dissipate signal power. The negative current spreading metal layer 921 is deposited on the back side of the original wafer substrate 900, if the substrate is a conductive material. The positive electrode connection wire 915 and the negative electrode connection wire 925 are bonded to bonding pads 909 and 924, respectively, to provide voltage and current to the LED structure. If the substrate 900 is a non-conductive material, then vias or through-holes must be formed through the substrate so that negative electrode connections can be made to the N-type epitaxial layers, as described above.

Figure 11B:
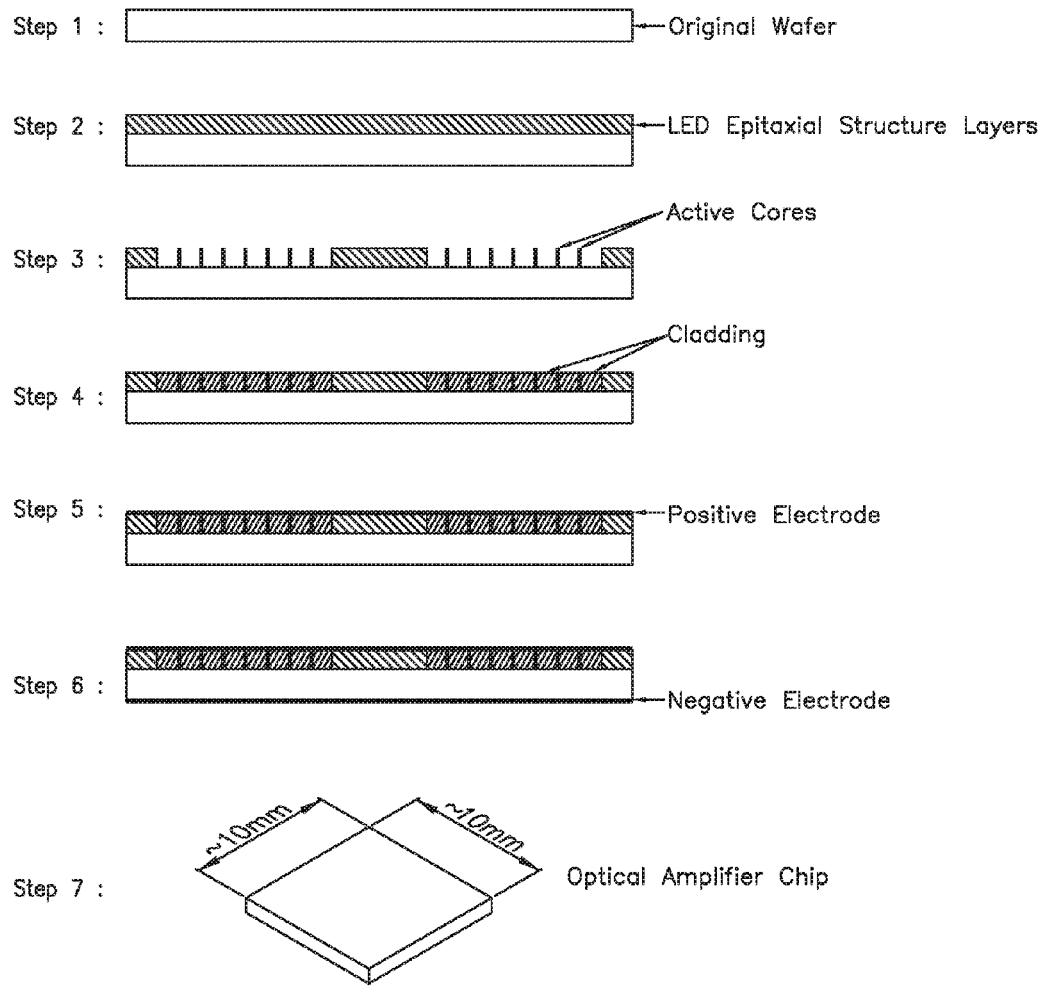
FIG. 11B illustrates an exemplary process for the fabrication of the embodiments such as shown in FIG. 11A.

In order to fabricate the material structure of the embodiments o shown in FIGS. 9, 10, and 11A, as well as the similar embodiments shown in FIGS. 13 and 14, an exemplary sequence of fabrication processes is illustrated in FIG. 11B:

1. Select a semiconductor wafer such as GaAs, which has a lattice constant that is similar to the subsequent epitaxial layers.
2. Grow N-type layers, a QW, and then P-type layers onto the wafer, by either Metal-Organic Chemical Vapor Deposition (MOCVD) or Molecular Beam Epitaxy (MBE), having an LED structure that is similar to the illustration in FIG. 6A.
3. Use photolithography and then chemical vapor etching or wet etching to create a spiral active core loop 1105 (and LED emitting regions), its corresponding grooves, and a slot 1102 for later insertion of a wave plate, as shown in FIGS. 9, 10, and 11A.
4. Utilize either chemical vapor deposition or physical sputtering to deposit an erbium-doped $SiO_2$ layer to the grooves, until this cladding material is level to the N-type layers of the active core loop.
5. Deposit a metal layer for positive current spreading, and then its bond pad(s).
6. Deposit a metal layer to the back side of the wafer substrate for negative current spreading, and then its bond pad(s). (As discussed above, if the wafer substrate is a non-conductive material, then vias or through-holes must be formed through the substrate material, to establish electrical connections between the negative bond pads and the N-type epitaxial layers.)
7. Dice the finished wafer into individual optical amplifier chips, which have dimensions of about 10 mm×10 mm, and then insert the wave plate 1108.

As with FIG. 3B above, FIG. 11B is meant as an example and variations and alternatives may be employed; and the use of "steps" in FIG. 11B is for expository purposes.

It should be noted that the top and bottom cladding layers in the embodiments described in FIGS. 3A, 4, and 5, and FIGS. 7 and 8, are not required for the embodiments described in FIGS. 9, 10, and 11A, and FIGS. 13 and 14. This is because the active cores and their surrounding claddings (of the embodiments shown in FIGS. 9, 10, and 11A, and FIGS. 13 and 14) act like slab wave guides. Thus there is no need to remove the original substrate wafer and then bond a new wafer to the LED epitaxial structure.

The foregoing detailed description has been presented for purposes of illustration and description. It is not intended to be exhaustive or to limit the invention to the precise form disclosed. Many modifications and variations are possible in light of the above teaching. The described embodiments were chosen in order to best explain the principles involved and their practical application, to thereby enable others skilled in the art to best utilize the various embodiments and with various modifications as are suited to the particular use It is claimed:

1. An optical amplifier, comprising:
   a substrate;
   an optical core formed on the substrate providing an optical path from an optical input to an optical output;
   one or more light emitting structures formed over the substrate within and/or adjacent to the optical core;
   cladding along the optical core and light emitting structure, the cladding having an index of refraction that is lower than an index of refraction of the optical core, and wherein the cladding is doped with one or more dopant elements or materials; and
   electrical contacts connected to the light emitting structure, whereby in response to a voltage differential applied thereto the light emitting structure illuminates at least a portion of the doped cladding,
   wherein the dopant elements or materials emit light within a first wavelength range when illuminated by the light emitting structure by light of a wavelength that is shorter than that of the first wavelength range.

2. The optical amplifier of claim 1, wherein the light emitting structure includes a light emitting diode (LED) structure.

3. The optical amplifier of claim 2, wherein LED structure includes one or more quantum wells.

4. The optical amplifier of claim 1, wherein the light emitting structure is formed within part of at least a portion of the optical core.

5. The optical amplifier of claim 1, wherein the light emitting structure is formed on the substrate adjacent to at least a portion of the optical core and separated therefrom by the cladding.

6. The optical amplifier of claim 1, wherein the first wavelength range is a subset of a range of 400 nm to 3,000 nm.

7. The optical amplifier of claim 1, wherein the one or more of the dopant elements or materials includes one or more rare-earth elements or metals.

8. The optical amplifier of claim 7, wherein the one or more of the rare-earth elements include erbium.

9. The optical amplifier of claim 7, wherein the one or more of the rare-earth elements include one or more of praseodymium, thulium, ytterbium, or neodymium.

10. The optical amplifier of claim 1, further comprising:
    a wave plate in the optical path from the optical input to the optical output.

11. The optical amplifier of claim 1, further comprising:
    a polarization rotator in the optical path from the optical input to the optical output.

12. The optical amplifier of claim 1, further comprising:
    a polarization uniting structure between the optical input and at least a portion of the optical core, wherein the polarization uniting structure includes a polarization rotator such that polarizations of light incident at the optical input are combined into a single polarization.

13. The optical amplifier of claim 1, wherein the cladding includes a broadband sensitizer.

14. The optical amplifier of claim 1, wherein as formed on the substrate the optical core has a spiral-type of geometry that loops back on itself such that adjacent portions of the optical path run in opposite directions.

15. A method of forming an optical amplifier, comprising:
    growing a light emitting epitaxial layer on a first surface of a substrate;
    forming a patterned optical core and a light emitting structure within and/or adjacent to the optical core from the light emitting epitaxial layer;
    depositing cladding along the optical core and light emitting structure, the cladding having an index of refraction that is lower than an index of refraction of the optical core, and wherein the cladding is doped with one or more dopant elements or materials, wherein the dopant elements or materials emit light within a first wavelength range when illuminated by light of a wavelength that is shorter than that of the first wavelength range;
    fabricating a first set of electrical connections over the light emitting structure, the first set of electrical connections contacting the light emitting structure; and
    fabricating a second set of electrical connections on or penetrating through a second surface of the substrate, the second set of electrical connections electrically contacting the light emitting structure.

16. The method of claim 15, wherein the substrate is conductive and the second set of electrical connections are formed on the second surface of the substrate.

17. The method of claim 15, wherein the second set of electrical connections penetrate the substrate to thereby contact the light emitting structure.

18. The method of claim 15, wherein the light emitting structure includes a light emitting diode (LED) structure.

19. The method of claim 18, wherein LED structure includes one or more quantum wells.

20. The method of claim 15, wherein the light emitting structure is formed within part of at least a portion of the optical core.

21. The method of claim 15, wherein the light emitting structure is formed on the first surface of the substrate adjacent to at least a portion of the optical core and separated therefrom by the cladding.

22. The method of claim 15, wherein the first wavelength range is a subset of a range of 400 nm to 3,000 nm.

23. The method of claim 15, wherein the one or more of the dopant elements or materials includes one or more rare-earth elements or metals.

24. The method of claim 23, wherein the one or more of the rare-earth elements include erbium.

25. The method of claim 23, wherein the one or more of the rare-earth elements include one or more of praseodymium, thulium, ytterbium, or neodymium.

26. The method of claim 15, wherein the patterned optical core and light emitting structure are formed in an etching process.

27. The method of claim 15, wherein the cladding is deposited in a chemical vapor deposition process.

28. The method of claim 15, wherein the cladding is deposited in a sputtering process.

* * * * *